United States Patent
Kim et al.

(10) Patent No.: US 6,388,268 B1
(45) Date of Patent: May 14, 2002

(54) SEMICONDUCTING YBCO DEVICE AND SUPERCONDUCTING YBCO DEVICE LOCALLY CONVERTED BY AFM TIP AND MANUFACTURING METHODS THEREFOR

(75) Inventors: Byong-man Kim, Kunpo; Insang Song, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 09/670,315

(22) Filed: Sep. 26, 2000

(30) Foreign Application Priority Data

Nov. 9, 1999 (KR) ............................................ 99-49417

(51) Int. Cl.$^7$ ............................................... H01L 29/06
(52) U.S. Cl. ................. 257/9; 257/30; 257/31; 257/33; 438/400; 438/416; 505/329; 505/702
(58) Field of Search ................. 257/9, 30, 31, 257/32, 33, 34, 35; 438/2, 400, 412, 416; 505/329, 702

(56) References Cited

U.S. PATENT DOCUMENTS 5,763,933 A * 6/1998 White .......................... 257/528
6,147,360 A * 11/2000 Odagawa et al. ............. 257/33
6,160,266 A * 12/2000 Odagawa et al. ............. 257/36
6,207,067 B1 * 3/2001 Yutani et al. .................. 216/3

* cited by examiner

*Primary Examiner*—Sara Crane
(74) *Attorney, Agent, or Firm*—Burns, Doane, Swecker & Mathis, L.L.P.

(57) ABSTRACT

A semiconducting yttrium-barium-copper-oxygen(YBCO) device which locally converts a semiconducting YBCO film to a nonconducting YBCO film by a conductive atomic force microscope (AFM), a superconducting YBCO device which locally converts a superconducting YBCO film to nonsuperconducting YBCO by an AFM, and manufacturing methods thereof are provided. According to a method of manufacturing a semiconducting YBCO device or a superconducting YBCO device locally converted by an AFM tip, a voltage is applied to the local region of a semiconducting YBCO channel or a superconducting YBCO channel by an AFM tip. This can produce a nonconducting YBCO region or nonsuperconducting YBCO region to thereby manufacture a tunnel junction easily without any patterning process by microfabrication including photolithography and dry/wet etching.

4 Claims, 7 Drawing Sheets

SEMICONDUCTING YBCO DEVICE AND SUPERCONDUCTING YBCO DEVICE LOCALLY CONVERTED BY AFM TIP AND MANUFACTURING METHODS THEREFOR

This application claims priority under 35 U.S.C. §§119 and/or 365 to 99-49417 filed in Korea on Nov. 9, 1999; the entire content of which is hereby incorporated by reference.

BACKGROUND OF THE INVENTION

1. Field of the Invention

The present invention relates to semiconducting yttrium-barium-copper-oxygen (YBCO) device in which semiconducting YBCO film is locally converted to a nonconducting YBCO film using a conductive atomic force microscope (AFM) and superconducting YBCO device in which superconducting YBCO film is locally converted to a nonsuperconducting YBCO film by an AFM, and manufacturing methods therefor.

2. Description of the Related Art

FIG. 1 is a graph showing the electrical characteristic of a typical semiconducting YBCO film, and FIG. 2 is a graph showing the electrical characteristic of a typical superconducting YBCO film. It can be seen that as the temperature falls, a semiconducting YBCO film shows a high resistivity, while a superconducting YBCO film shows superconducting properties, i.e., the resistivity drops to zero below a specific critical temperature. There are various factors that determine the semiconducting properties or superconductivity of YBCO films. As one of these factors, FIG. 3 shows experimental results, which indicate that the semiconducting and superconducting properties are dependent on oxygen content. More specifically, FIG. 3 shows the electrical properties with respect to changes in the value of parameter y where y=7−x in $YBa_2Cu_3O_{7-x}$ film. According to the experimental results shown in FIG. 3, a YBCO film shows semiconducting properties if $y \leq 6.3$ while it shows superconducting properties if $y \geq 6.5$. The YBCO material has difficulty in manufacturing tunnel junctions through dry or chemical etching due to its chemical sensitivity. Furthermore, it is well known that the material has a problem in high volume production since the characteristics between thus manufactured tunnel junctions are irregular. Accordingly, adoption of a planar patterning method which locally converts YBCO film through electrical or physical change is required.

SUMMARY OF THE INVENTION

To solve the above problem, it is a first objective of the present invention to provide a semiconducting yttrium-barium-copper-oxygen (YBCO) device which is locally converted by an atomic force microscope (AFM) in such a way as to electrically convert a portion of YBCO film, and a manufacturing method thereof.

It is a second objective to provide a superconducting YBCO device which is locally converted by an AFM in such a way as to electrically convert a portion of YBCO film, and a manufacturing method thereof.

Accordingly, to achieve the first objective, the present invention provides a semiconducting YBCO device locally converted by AFM which includes a MgO substrate, a semiconducting YBCO film stacked on the MgO substrate, a nonconducting YBCO region locally converted so as to form a tunnel junction in the semiconducting YBCO film, and electrodes which are formed at the ends of the semiconducting YBCO film.

The present invention also provides a method of manufacturing a semiconducting YBCO device locally converted by an AFM including the steps of: depositing a semiconducting YBCO film over a MgO substrate; forming electrodes at the ends of the semiconducting YBCO film, and placing an AFM tip on the semiconducting YBCO film between the electrodes and applying a predetermined voltage between the AFM tip and the electrodes to convert a local region of the semiconducting YBCO film contacted by the AFM tip to a nonconducting YBCO so that a tunnel junction may be formed in the local region of the semiconducting YBCO film.

To achieve the second objective, the present invention provides a superconducting YBCO device locally converted by an AFM including a MgO substrate, a superconducting YBCO film stacked on the MgO substrate, a nonsuperconducting YBCO region locally converted so as to form a tunnel junction in the superconducting YBCO film, and electrodes which are formed at the ends of the superconducting YBCO film.

The present invention provides a method of manufacturing a superconducting YBCO device locally converted by an AFM including the steps of: depositing a superconducting YBCO film over a MgO substrate; forming electrodes at the ends of the superconducting YBCO film; and placing an AFM tip on the superconducting YBCO film between the electrodes and applying a predetermined voltage between the AFM tip and the electrodes to convert a local region of the superconducting YBCO film contacted by the AFM tip to a nonsuperconducting YBCO so that a tunnel junction may be formed in the local region of the superconducting YBCO film.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
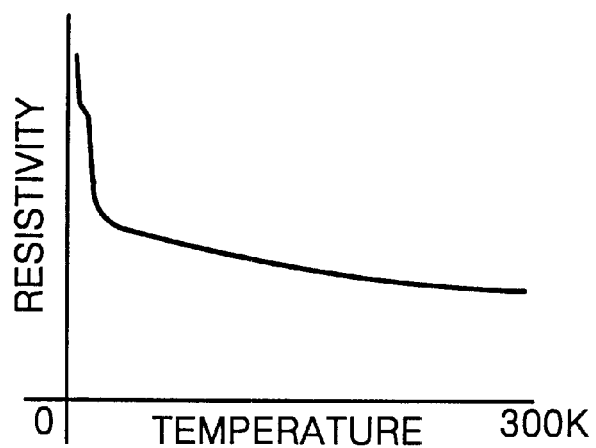
FIG. 1 is a graph showing the electrical characteristics of a typical semiconducting yttrium-barium-copper-oxygen (YBCO) film.
Figure 4:
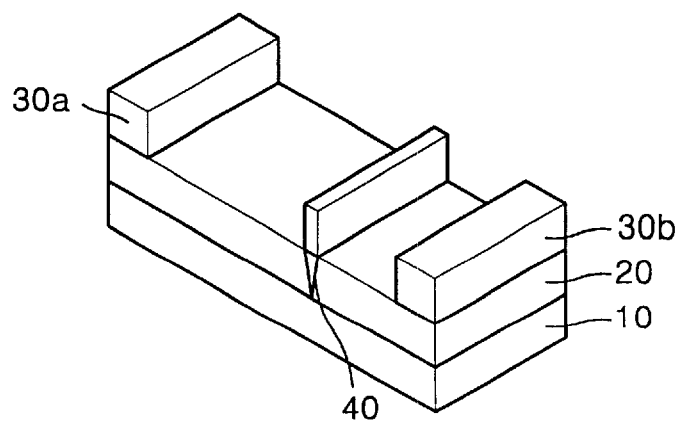
FIG. 4 is a perspective view showing the schematic configuration of a semiconducting YBCO device locally converted by atomic force microscope (AFM) according to the present invention.

Referring to FIG. 4, a semiconducting device locally converted by an atomic force microscope (AFM) according to the present invention basically includes a MgO substrate 10, and a semiconducting yttrium-barium-copper-oxygen (YBCO) film 20 stacked on the MgO substrate 10, and electrodes 30a and 30b. The device is marked by having a nonconducting. YBCO region 40 locally converted so as to form a tunnel junction in the semiconducting YBCO film 20. In this case, the electrical characteristics of the semiconducting YBCO film 20 are defined by the resistivity-temperature (R-T) curve shown in FIG. 1. Thus, the resistivity-temperature (R-T) curve of the semiconducting YBCO film shows the feature that resistivity significantly increases without any sign of transition to superconductivity as the temperatures decreases. The electrodes 30a and 30b both are formed at the ends of the semiconducting YBCO film 20.

Figure 5:
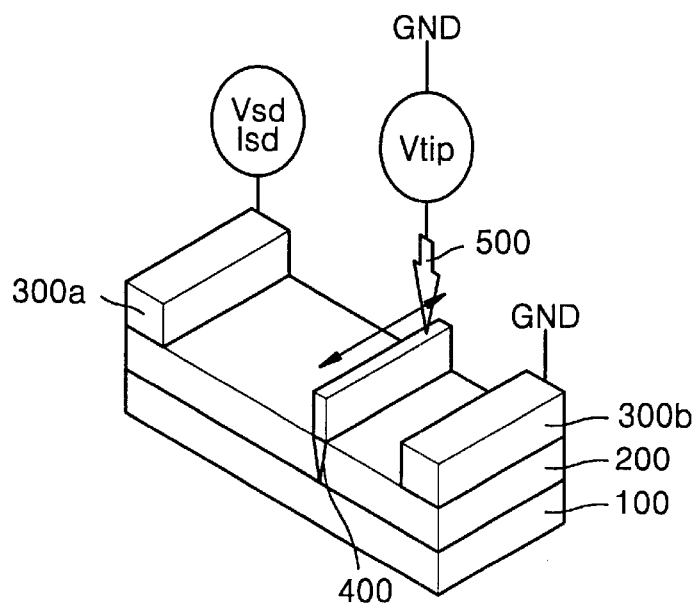
FIG. 5 illustrates a method of manufacturing the semiconducting YBCO device locally converted by the AFM according to the present invention of FIG. 4.

A method of manufacturing the semiconducting YBCO device locally converted by the AFM is shown in FIG. 5. As shown, in order to overcome problems that the conventional art has, a method of manufacturing the semiconducting YBCO device locally converted by an AFM according to the present invention converts YBCO film locally using an AFM tip through the following steps.

First, a semiconducting YBCO film 200 is deposited over a MgO substrate 100. Then,, electrodes 300a and 300b are formed at the ends of the semiconducting YBCO film 200. Next, the AFM tip is placed on the semiconducting YBCO film 200 between the electrodes 300a and 300b, and then a predetermined voltage is applied between the AFM tip and the electrodes 300a and 300b to convert a local region of the semiconducting YBCO film 200 in contact with the AFM tip to a nonconducting YBCO. As a result, a tunnel junction 400 is formed in the local region of the semiconducting YBCO film 200 contacted by the AFM tip. A process of converting the local region of the semiconducting YBCO film 200 to a nonconducting YBCO film by the AFM tip has to be accomplished in an atmosphere containing an appropriate amount of moisture and carbon dioxide ($CO_2$) gas, not within a vacuum chamber. This is because the local region of the semiconducting YBCO film 200 is converted to a nonconducting YBCO film by a mechanism shown in FIG. 6 if a voltage is applied to the region using the AFM tip.

Figure 6:
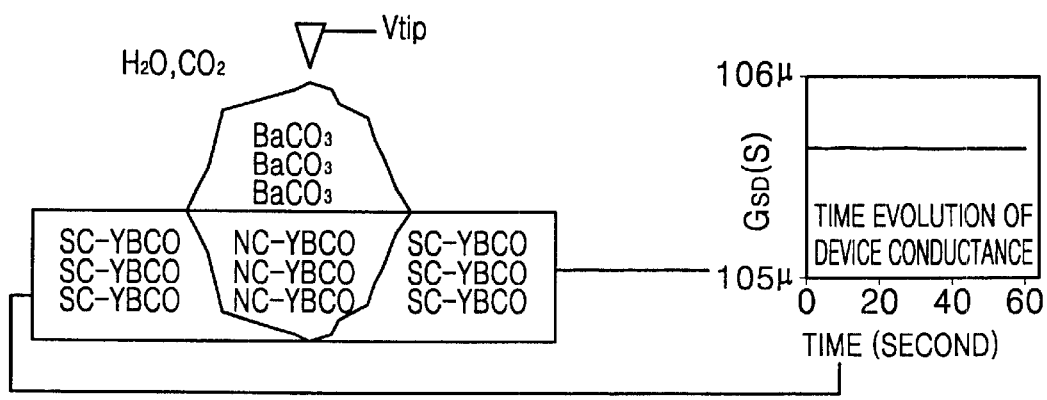
FIG. 6 is a model illustrating a process of converting a semiconducting YBCO by the method of manufacturing the semiconducting YBCO device locally converted by the AFM shown in FIG. 5.

FIG. 6 is a model showing the converting process proposed by the present invention. Referring to FIG. 6, when a voltage is applied to the semiconducting YBCO film 200 using the AFM tip, barium (Ba) ions on the surface of the semiconducting YBCO region, to which a voltage is applied, react electrochemically with water ($H_2O$) and carbon dioxide ($CO_2$) gas in the air to locally form barium carbonate ($BaCO_3$) on the surface of the semiconducting YBCO region. Barium (Ba) ions within a YBCO lattice move toward the YBCO surface in which reaction takes place by field induced diffusion. The moved Ba ions repeatedly react with $H_2O/CO_2$ in the air, which increases the volume expansion of $BaCO_3$. Through this process, the semiconducting YBCO film, in which Ba content of the local region is locally changed, is converted to a nonconducting YBCO film. The process is expressed by the following chemical formula (1):

$$2Ba + 2 H_2O = 2BaOH + H_2 \uparrow$$

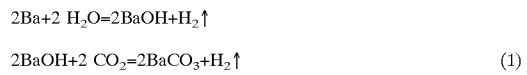

$$2BaOH + 2 CO_2 = 2BaCO_3 + H_2 \uparrow \tag{1}$$

Figure 2:
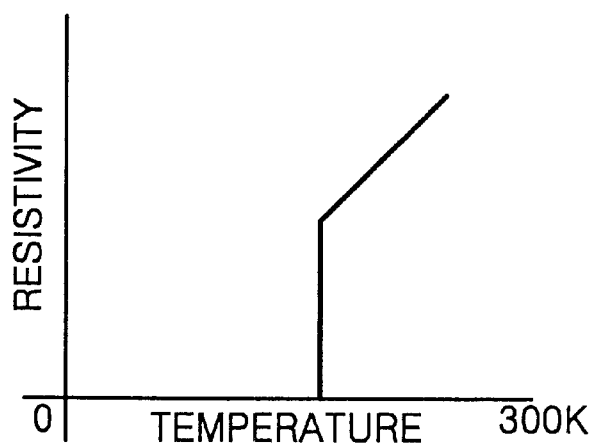
FIG. 2 is a graph showing the electrical characteristics of a typical superconducting YBCO film.
Figure 3:
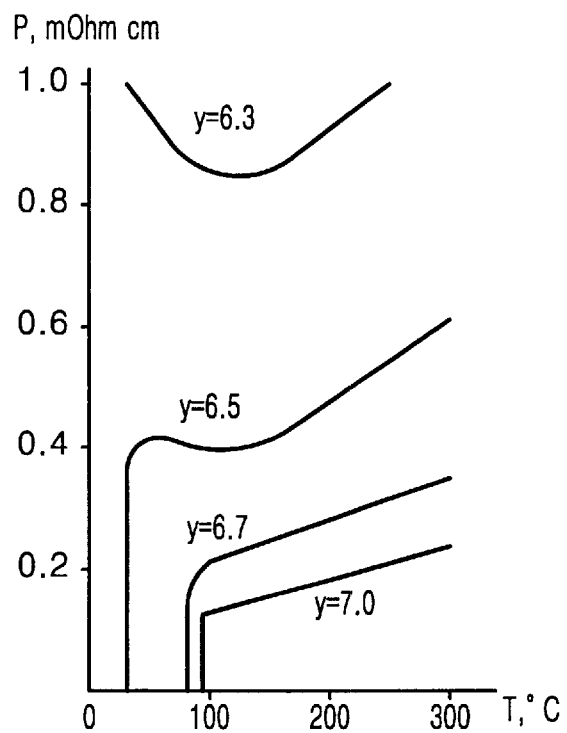
FIG. 3 is a graph showing the electrical characteristics with respect to oxygen content in a YBCO film, i.e., the value of parameter y calculated when y=7−x in $YBa_2Cu_3O_{7-x}$ film.
Figure 7:
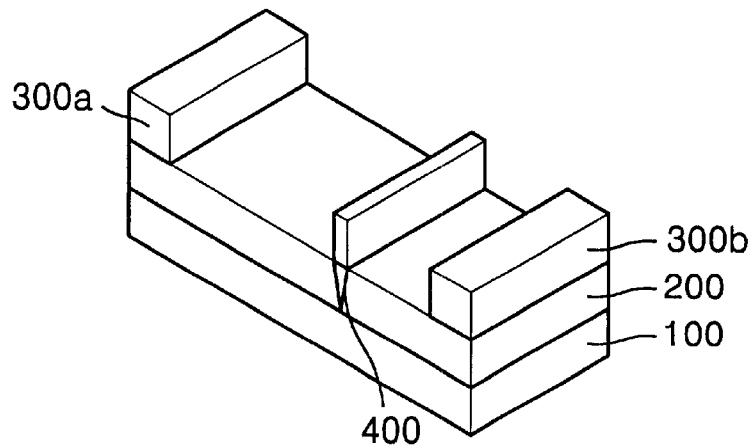
FIG. 7 is a perspective view showing the schematic configuration of a superconducting YBCO device locally converted by AFM according to the present invention.

Meanwhile, FIG. 7 is a perspective view showing the schematic configuration of a superconducting YBCO device locally converted by the AFM according to the present invention. As shown, the superconducting YBCO device locally converted by the AFM according to the present invention basically includes a MgO substrate 100, and a superconducting YBCO film 200 stacked on the MgO substrate 100, and electrodes 300a and 300b. The device is characterized in that it has a nonsuperconducting YBCO region 400 locally converted so as to form a tunnel junction in the superconducting YBCO film 200. In this case, the electrical characteristics of the superconducting YBCO film 200 is defined by the resistivity-temperature (R-T) curve shown in FIG. 2. Thus, the resistivity-temperature (R-T) curve of the superconducting YBCO film shows the feature that resistivity abruptly drops to zero when temperature falls below a critical temperature (about 86 K). The electrodes 300a and 300b are formed at the ends of the superconducting YBCO film 200.

Figure 8:
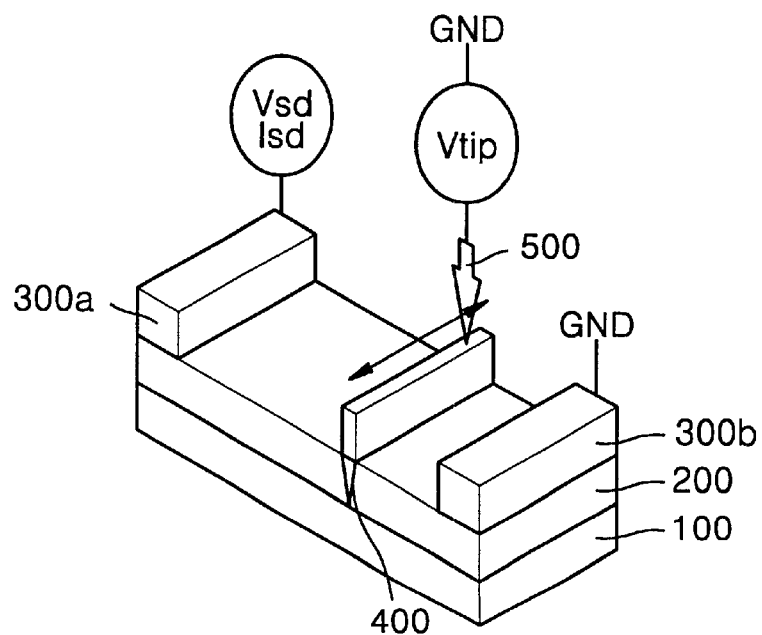
FIG. 8 illustrates a method of manufacturing the superconducting YBCO device locally converted by the AFM according to the present invention of FIG. 7.

A method of manufacturing the superconducting YBCO device locally converted by an AFM is shown in FIG. 8. As shown, in order to solve problems that the conventional art has, according to the method of manufacturing the superconducting YBCO device locally converted by the AFM according to the present invention, YBCO film is locally converted using an AFM tip.

First, a superconducting YBCO film 200 is deposited over a MgO substrate 100. Then, electrodes 300a and 300b are formed at the ends of the superconducting YBCO film 200. Next, an AFM tip is placed on the superconducting YBCO film 200 between the electrodes 300a and 300b, and then a predetermined voltage is applied between the AFM tip and the electrodes 300a and 300b to convert a local region of the superconducting YBCO film 200 in contact with the AFM tip to a nonsuperconducting YBCO film. As a result, a tunnel junction 400 is formed in the local region of the superconducting YBCO film 200 contacted by the AFM tip. A process of converting the local region of the superconducting YBCO film 200 to a nonsuperconducting YBCO film by the AFM tip has to be accomplished in an atmosphere containing an appropriate amount of moisture and carbon dioxide ($CO_2$) gas, not within a vacuum chamber. This is because the local region of the superconducting YBCO film 200 is converted to a nonsuperconducting YBCO film by a mechanism shown in FIG. 9 if a voltage is applied to the region using the AFM tip.

Figure 9:
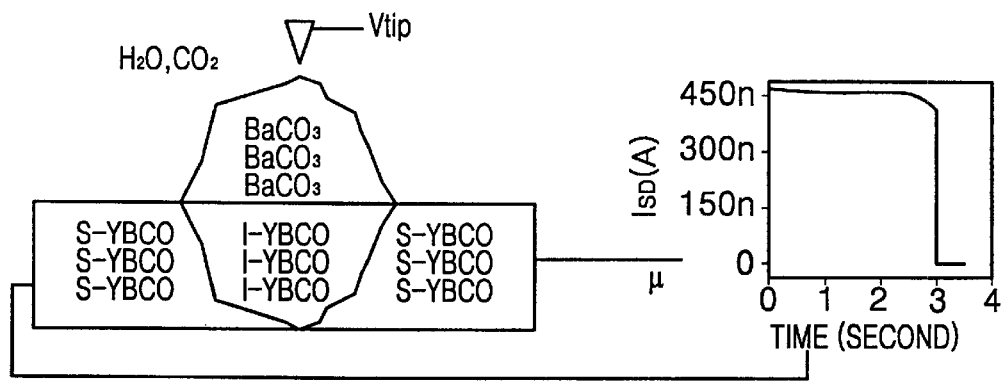
FIG. 9 is a model illustrating a process of converting a superconducting YBCO by the method of manufacturing the superconducting YBCO device locally converted by AFM shown in FIG. 8.

FIG. 9 is a model showing the converting process proposed by the present invention. Referring to FIG. 9, when a voltage is applied to the superconducting YBCO film 200 using the AFM tip, barium (Ba) ions on the surface of the superconducting YBCO region, to which a voltage is applied, react electrochemically with water ($H_2O$) and carbon dioxide ($CO_2$) gas in the air to locally form barium carbonate ($BaCO_3$) on the superconducting YBCO surface. Barium (Ba) ions within a YBCO lattice move toward the surface of the YBCO region in which reaction takes place by field induced diffusion. The moved Ba ions repeatedly react with $H_2O/CO_2$ in the air, which increases the volume expansion of $BaCO_3$. Through this process, the superconducting YBCO film, in which Ba content of the local region is locally changed, is converted to a nonsuperconducting YBCO film. The process is expressed by chemical formula (1).

EMBODIMENT

Figure 10:
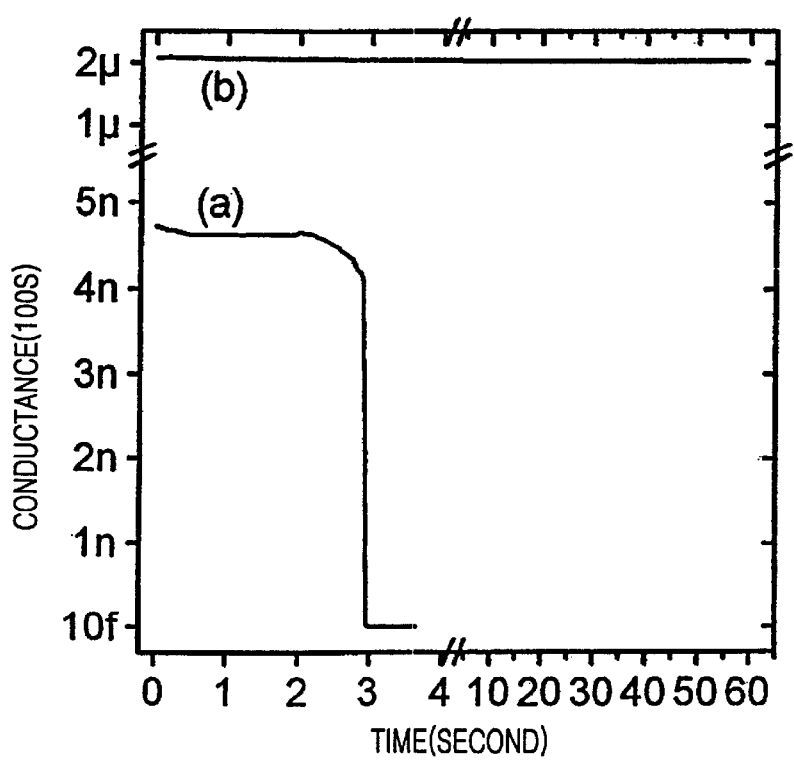
FIG. 10 illustrates the results of measuring conductance while an AFM modification is applied to a semiconducting YBCO film (strip) and a superconducting YBCO film (strip), respectively, wherein curve (a) is the result of measuring the former's conductance, and curve (b) is the result of measuring the latter's conductance.
Figure 11A:
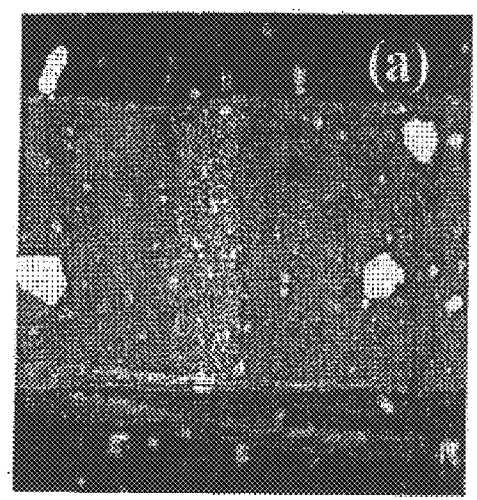
FIG. 11A is a photo showing the section of a semiconducting YBCO film (strip) after AFM modification is applied.
Figure 11A:
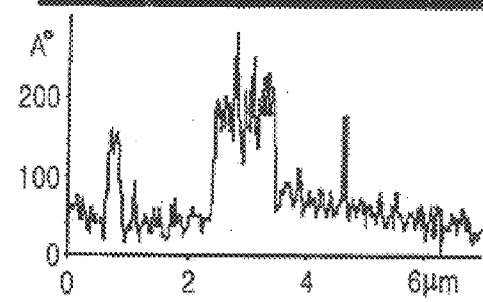

Curve (a) in FIG. 10 indicates the conductance of a semiconducting YBCO film (strip) measured while AFM modification is applied, and FIG. 11A is a photo showing a cross section of the semiconducting YBCO film (strip) after AFM modification is applied. As discussed in the previous modification model of FIG. 6, it can be seen in FIG. 11A that a "striped pattern", i.e., $BaCO_3$ having a height of about 20 nm, is formed on the surface. A significant drop in the conductance of the strip to below a measuring limit, as shown in the curve (a) of FIG. 10, demonstrates that a semiconducting YBCO film placed under the "stripe" is converted to a nonconducting YBCO as discussed in the relevant model.

Figure 11B:
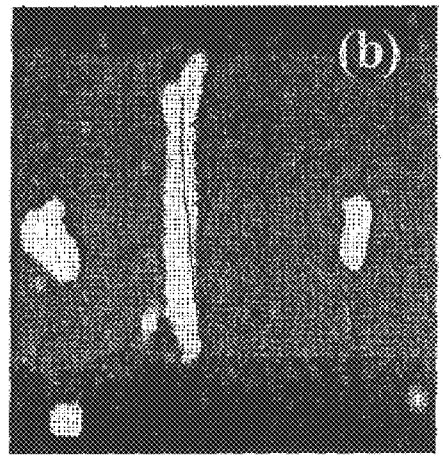
FIG. 11B is a photo showing the section of a superconducting YBCO film (strip) after AFM modification is applied.
Figure 11B:
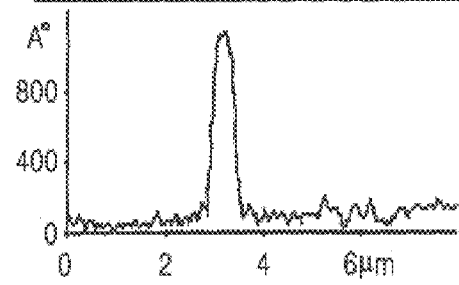

Curve (b) in FIG. 10 shows the conductance of a superconducting YBCO film (strip) measured while AFM modification is applied, and FIG. 11B is a photo showing a cross section of the superconducting YBCO film (strip) after AFM modification is applied. As discussed in the previous modification model of FIG. 9, it can be seen in FIG. 11B that a "striped pattern", i.e., $BaCO_3$ having a height of about 100 nm, is formed on the surface. The constant conductance of the strip in the curve (b) of FIG. 10 means that a superconducting YBCO placed under the "stripe" is converted to a nonsuperconducting YBCO as discussed in the relevant model. In order to further examine the degree in conversion of a superconducting YBCO and the electrical properties of the converted YBCO, comparisons are made by measuring resistivity-temperature (R-T) characteristic before and after conversion.

Figure 12:
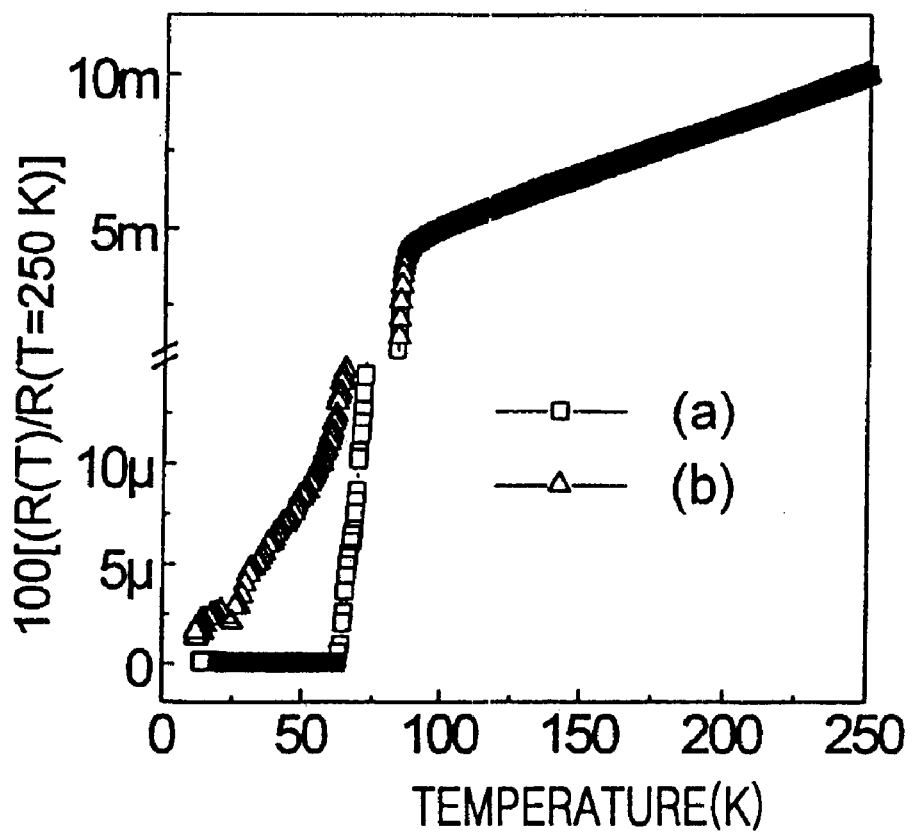
FIG. 12 is a graph showing the results of measuring the electrical characteristics, i.e., resistivity-temperature characteristic, before and after the superconducting YBCO film is changed, wherein curve (a) shows the superconducting properties before the change occurs and curve (b) shows the superconducting properties after the change occurs.

Curve (a) in FIG. 12 indicates the superconducting properties before conversion, and curve (b) in FIG. 12 indicates the nonsuperconducting properties after conversion. The R-T curve before conversion shows that resistance is zero below 65 K, while the R-T curve after conversion shows that resistance still exists even at a temperature of 10 K. The results mean that conversion from superconducting YBCO to nonsuperconducting YBCO occurs from below the surface. Furthermore, in view of the fact that R-T curves before and after change are identical with each other at a temperature above 85 K, it can be found that conductivity of the nonsuperconducting YBCO after conversion is similar to that of the superconducting YBCO before conversion.

As described above, according to a method of manufacturing a semiconducting YBCO device or a superconducting YBCO device locally converted by an AFM tip, a voltage is applied to the local region of a semiconducting YBCO channel or a superconducting YBCO channel by an AFM tip. This can produce a nonconducting YBCO region or nonsuperconducting YBCO region to thereby manufacture a tunnel junction easily without a patterning process by microfabrication including photolithography and dry/wet etching.

What is claimed is:

1. A semiconducting yttrium-barium-copper-oxygen (YBCO) device locally converted by an atomic force microscope (AFM), the device comprising:

a MgO substrate;

a semiconducting YBCO film stacked on the MgO substrate;

a nonconducting YBCO region locally converted so as to form a tunnel junction in the semiconducting YBCO film; and electrodes formed at the ends of the semiconducting YBCO film.

2. A method of manufacturing a semiconducting yttrium-barium-copper-oxygen (YBCO) device locally converted by an atomic force microscope (AFM), the method comprising the steps of:

depositing a semiconducting YBCO film over a MgO substrate;

forming electrodes at the ends of the semiconducting YBCO film; and placing an AFM tip on the semiconducting YBCO film between the electrodes and applying a predetermined voltage between the AFM tip and the electrodes to convert a local region of the semiconducting YBCO film contacted by the AFM tip to a nonconducting YBCO so that a tunnel junction may be formed in the local region of the semiconducting YBCO film.

3. A superconducting yttrium-barium-copper-oxygen (YBCO) device locally converted by an atomic force microscope (AFM), the device comprising:

a MgO substrate;

a superconducting YBCO film stacked on the MgO substrate;

a nonsuperconducting YBCO region locally converted so as to form a tunnel junction in the superconducting YBCO film; and electrodes formed at the ends of the superconducting YBCO film.

4. A method of manufacturing a superconducting yttrium-barium-copper-oxygen (YBCO) device locally converted by an atomic force microscope (AFM), the method comprising the steps of:

depositing a superconducting YBCO film over a MgO substrate;

forming electrodes at the ends of the superconducting YBCO film; and placing an AFM tip on the superconducting YBCO film between the electrodes and applying a predetermined voltage between the AFM tip and the electrodes to convert a local region of the superconducting YBCO film contacted by the AFM tip to a nonsuperconducting YBCO so that a tunnel junction may be formed in the local region of the superconducting YBCO film.

* * * * *